United States Patent [19]
Tanaka et al.

[11] Patent Number: 5,392,304
[45] Date of Patent: Feb. 21, 1995

[54] SEMICONDUCTOR LASER AND MANUFACTURING METHOD THEREFOR

[75] Inventors: Haruo Tanaka; Masato Mushiage; Kaoru Kusunoki, all of Kyoto, Japan

[73] Assignee: Rohm Co., Ltd., Kyoto, Japan

[21] Appl. No.: 69,855

[22] Filed: Jun. 1, 1993

[30] Foreign Application Priority Data

Jun. 4, 1992 [JP] Japan .................. 4-144225

[51] Int. Cl.$^6$ .............................................. H01S 3/04
[52] U.S. Cl. ...................................... 372/36; 372/45; 372/46; 369/122
[58] Field of Search .................. 372/36, 45, 46; 369/122

[56] References Cited

U.S. PATENT DOCUMENTS

| | | | |
|---|---|---|---|
| 4,748,482 | 5/1988 | Collins | 372/36 |
| 4,757,510 | 7/1988 | Kaneno et al. | 372/45 |
| 4,974,231 | 11/1990 | Gomyo | 372/45 |
| 4,987,566 | 1/1991 | Shikama et al. | 372/36 |
| 5,146,467 | 9/1992 | Kadowaki et al. | 372/46 |

FOREIGN PATENT DOCUMENTS 2062346  5/1981  United Kingdom .................. 372/36

*Primary Examiner*—Georgia Y. Epps
*Attorney, Agent, or Firm*—Nikaido, Marmelstein, Murray & Oram

[57] ABSTRACT

A semiconductor laser adaptable for a 3-beam method, including a semiconductor laser chip bonded on a primary plane of a flat submount, the semiconductor laser chip having a thickness of 30 to 80 μm is provided. Also provided is a method for manufacturing a semiconductor laser including the steps of: sequentially stacking layers of compound semiconductor materials on a semiconductor substrate to form a semiconductor laser wafer; mechanically abrading the semiconductor substrate to make it thin; subjecting the mechanically abraded face of the semiconductor substrate to a chemical treatment; forming an electrode film on both sides of the semiconductor laser wafer thus treated; and cutting the semiconductor laser wafer into chips and bonding each of the chips on a submount.

4 Claims, 3 Drawing Sheets

SEMICONDUCTOR LASER AND MANUFACTURING METHOD THEREFOR

FIELD OF THE INVENTION

The present invention relates to a semiconductor laser and a manufacturing method therefor. More particularly, it relates to a semiconductor laser employing a 3-beam method wherein interference is prevented from being generated by reflection of a returing beam at an end face of a semiconductor laser chip, which is a part of a side beam reflected at a disk and passes through a diffraction grating of a beam splitter and then returns toward the semiconductor laser chip serving as a light source, and to a manufacturing method therefor.

BACKGROUND OF THE INVENTION

A semiconductor laser capable of continuous pulsation with a small current is used as a light source in various applications such as in optical communications and a pickup (information reading device) for compact disk players and optical disk memory devices. A package structure of a typical semiconductor laser for accommodating and supporting a semiconductor laser chip therein is shown as denoted by numeral 20 in FIG. 4. The semiconductor laser 20 comprises a disk-like stem 23a formed by processing an alloy material containing cobalt, copper, nickel or the like at a high precision, a bonding post 23b, a semiconductor laser chip 22 fixed on the bonding post 23b in such a manner that a submount 28 is interposed between the semiconductor laser chip 22 and the bonding post 28, and a photodiode 24 for monitoring. The semiconductor laser chip 22 and the photodiode 24 are connected to electrode terminals 25a and 25b, respectively through a gold wire or the like, and embraced and scalded in a cylindrical cap case 27 provided with a light-transmissive window 26 made of, for example, glass and mounted on the stem 23a. The inside of the semiconductor laser 20 is filled with inert gas. As the material for the submount 28, silicon is generally selected because of its excellent heat-releasing property and its thermal expansion coefficient which is approximate to that of a compound semiconductor forming the semiconductor laser chip 22. It is possible to form a photodiode for monitoring in this silicon submount.

In an optical pickup device, using the semiconductor laser 20 as a light source, a laser beam needs to be spotted with accuracy on a pit track formed in the disk face so that a tracking servo mechanism is indispensable. In such a tracking servo mechanism what is referred to as "3-beam method" is widely employed.

In this method, as shown in FIG. 4, the laser beam which is emitted from the semiconductor laser chip 22 is split into three beams through a diffraction grating 31 (in FIG. 4, reflected beams of the upper and lower beams are each split at the diffraction grating, as plotted with dotted line), reflected at a half mirror 32, and converged onto a disk (not shown) through an optical system such as a convex lens 33. The originally emitted beam is referred to as a main beam, while the two other beams produced at the diffraction grating are referred to as subbeams. The difference in light intensity between the subbeams reflected at the disk is detected so as to issue a fine control signal for an optical system comprising lens and the like.

With the 3-beam method, which offers a superior detection accuracy, however, it is known that the main beam reflected at the disk passes through the diffraction grating of the beam splitter while forming subbeams again and returns toward the semiconductor laser chip, or the light source. The returning beam is focused on the beam-emitting face of the semiconductor laser chip or the end face of the submount on the beam-emitting side. When focused on the beam-emitting face, the returning beam is regularly reflected thereat and runs toward the disk again. As a result, the reflected beam of the returning beam interferes with the normal beam so that the tracking servo or the like is made instable.

There have been proposed various countermeasures for preventing such interference due to the returning beam in the case of the 3-beam method. One of such countermeasures is to coat with a nonreflective film or a resin colored black a returning beam incident region of the beam-emitting face of the semiconductor laser chip or that of the end face of the submount on the beam-emitting side. The returning beam incident region is a region onto which the returning beam is focused. However, since the semiconductor laser chip and the submount themselves are very small as described above, this countermeasure has a disadvantage in mass productivity.

As the countermeasures against the returning beam which focuses on the submount, there are known such methods as to cause the returning beam to be reflected in a direction different from the beam-emitting direction by notching the returning beam incident region of the end face of the submount to provide inclination therein (refer to Japanese Unexamined Utility Model Publication No. 151362/1986), and as to cause the returning beam to be reflected in a direction different from the beam-emitting direction by utilizing as the returning beam incident region a cleavage plane of crystal which has an inclination with respect to the principal plane thereof (refer to Japanese Unexamined Patent Publication No. 24488/1989).

In the 3-beam method, as described above, the laser beam emitted from the semiconductor laser chip is split into three beams through the diffraction grating, and the returning beam which is reflected at the disk is also split into three beams when passing through the diffraction grating again. The two subbeams of the returning beam are focused on the upper and lower sides of the beam-emitting face of the semiconductor laser chip, respectively, and the reflected beams of the focused beams interfere with the normal beam thereby making the tracking servo instable. Although the problem caused by the subbeam which is focused on the lower side of the beam-emitting face is overcome by providing an inclination to the returning beam incident region of the submount, the problem caused by the subbeam which is focused on the upper side of the beam-emitting face remains unsolved because the art of notching to provide an inclination in the end face of the semiconductor laser chip or coating the end face with a nonreflective film is unsuitable for mass production. Further, if the semiconductor laser chip is made thinner to avoid such a problem, it is damaged by strain. Hence, the chip cannot be made thinner than 100 $\mu$m. For this reason, there are attempts to selectively coat a very small region onto which the subbeam is focused with a nonreflective film or a resin colored black. However, any of such methods is not yet established as a method adaptable for mass production.

SUMMARY OF THE INVENTION

Accordingly, it is an object of the present invention to provide a method which allows fabrication of a thin semiconductor laser chip, and a semiconductor laser having a thin semiconductor laser chip, so as to overcome the aforesaid problems.

According to the present invention, there is provided a semiconductor laser including a semiconductor laser chip bonded on a primary plane of a flat submount, the semiconductor laser chip having a thickness of 30 to 80 µm.

According to the present invention, there is also provided a method for manufacturing a semiconductor laser including the steps of: sequentially stacking layers of compound semiconductor materials on a semiconductor substrate to form a semiconductor laser wafer; mechanically abrading the semiconductor substrate to make the semiconductor laser wafer thin; subjecting the mechanically abraded face of the semiconductor substrate to a chemical treatment; forming an electrode film on both sides of the semiconductor laser wafer thus treated; and cutting the semiconductor laser wafer into chips and bonding each of the chips on a submount.

According to the present invention, there is still also provided a pickup device adaptable for a 3-beam method, including a combination of the aforesaid semiconductor laser, a diffraction grating, and an optical system.

Further, according to the present invention, there is still also provided an optical disk apparatus including the aforesaid pickup device.

In the method of the present invention, the substrate of the semiconductor laser wafer is made thin by lapping, and then a strained layer produced by lapping is removed. Hence, there can be obtained a thin semiconductor laser wafer which will not be damaged or cracked by post-handling because of no remaining strain.

By virtue of this method a semiconductor laser chip can be processed to have a thickness of 30 to 80 µm. Accordingly, the subbeam involved in the 3-beam method is never focused on the beam-emitting face of the semiconductor laser chip and, hence, no reflected beam thereof is produced. Consequently, there occurs no adverse effect such as interference of such a reflected beam of the subbeam with the originally emitted beam.

DETAILED DESCRIPTION

Figure 1A:
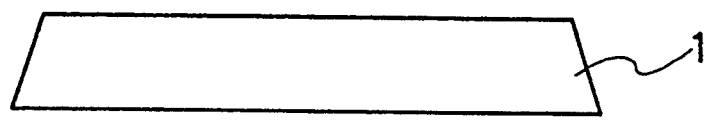
FIGS. 1(a)–1(d) are explanatory view for illustrating an example of the method for manufacturing a semiconductor laser chip according to the present invention.
Figure 1B:
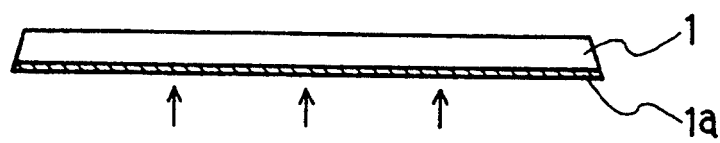
Figure 1C:
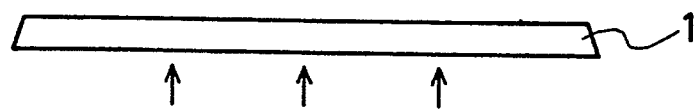
Figure 1D:
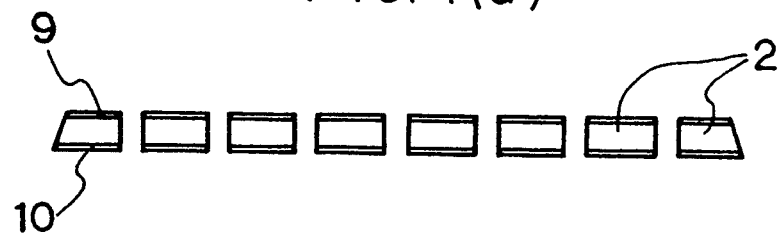
Figure 2:
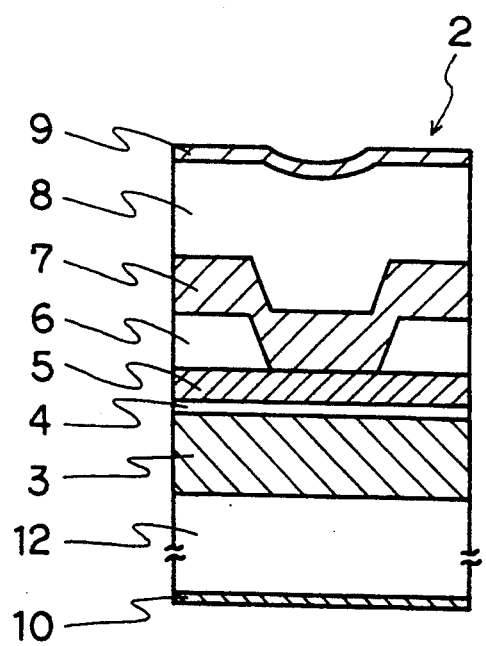
FIG. 2 is an explanatory view showing the structure of an embodiment of the semiconductor laser chip according to the present invention.

A semiconductor laser chip is constructed to have a sectional structure shown, for example, in FIG. 2. On a GaAs substrate 12 having a thickness of 200 to 500 µm is formed a clad layer 3 made of, for example, a n-type $Al_xGa_{1-x}As$ ($0.3 \leq x \leq 0.7$) layer having a thickness of about 1.3 µm which is epitaxially grown by a MBE method. Epitaxially grown thereon continuously is an active layer 4 made of a n-type $Al_xGa_{1-x}As$ ($0 \leq x \leq 0.2$) layer having a thickness of about 0.05 µm. Further epitaxially grown thereon is a lower clad layer 5 made of a p-type $Al_xGa_{1-x}As$ ($0.3 \leq x \leq 0.7$) layer having a thickness of about 0.3 µm. Further epitaxially grown thereon is a current-confining layer 6 made of a n-type GaAs layer having a thickness of about 0.6 µm, which is then etched to form a striped groove for confining the area of a current flow.

Figure 3:
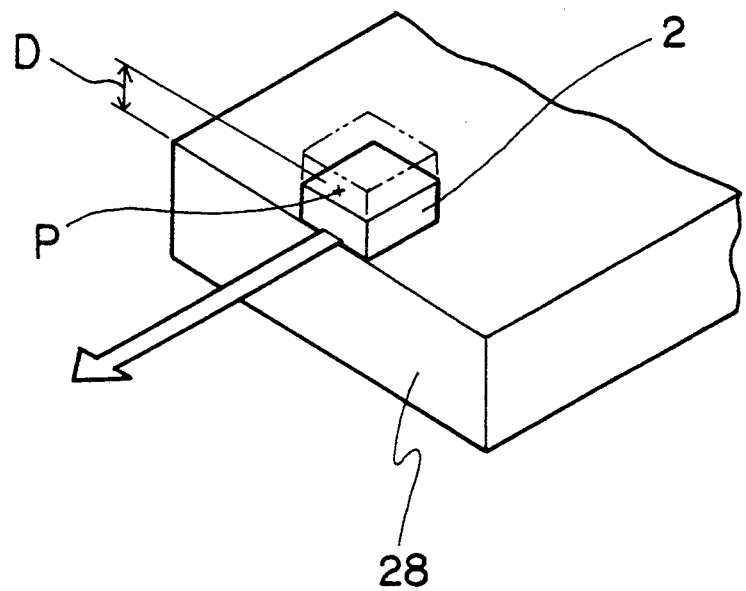
FIG. 3 is an explanatory view for illustrating the beam-emitting direction of the semiconductor laser chip bonded on a submount.
Figure 4:
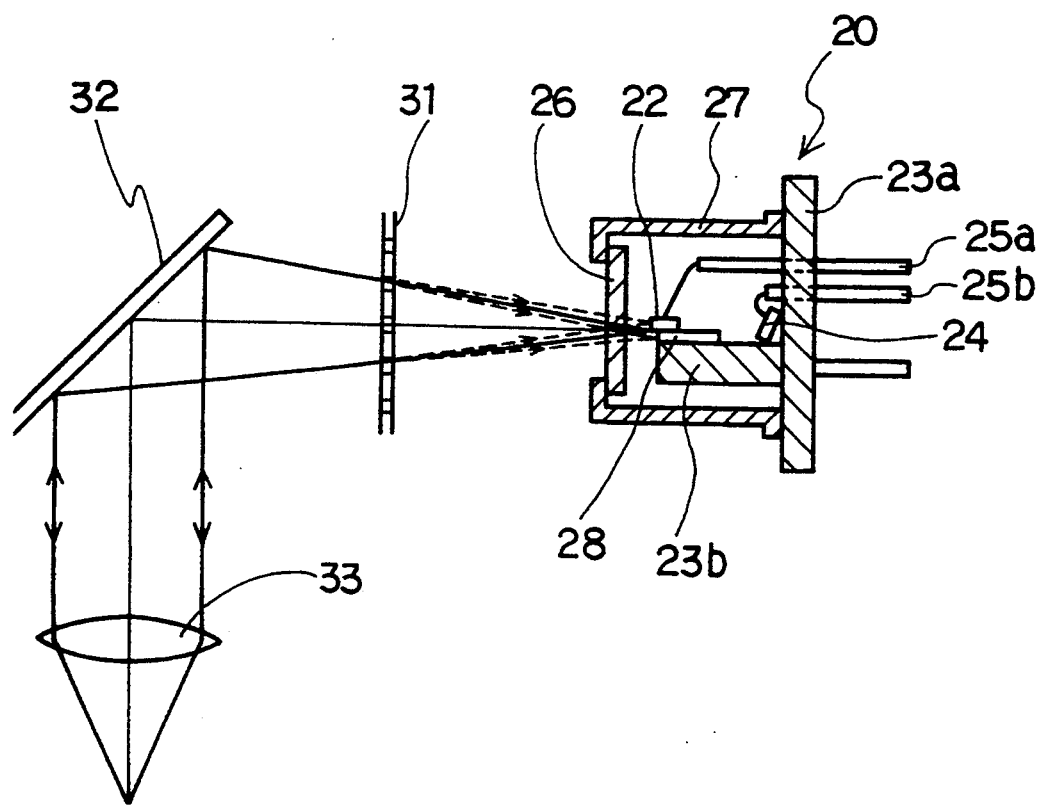
FIG. 4 is a schematic view of the structure of the semiconductor laser for explaining the 3-beam method.

In turn, thus treated substrate is placed in the MBE apparatus again and irradiated with molecular beams of arsenic while being heated, thereby to remove the contaminants (thermal cleaning step) which have adhered to the substrate during the preceding etching step. Subsequently, epitaxially grown and stacked by a second MBE process are an upper clad layer 7 made of a p-type $Al_xGa_{1-x}As$ ($0.3 \leq x \leq 0.7$) layer having a thickness of about 1 µm and a cap layer 8 made of a p-type GaAs having thickness of about 3 µm. Thereafter, thus constructed structure is abraded at the GaAs substrate side thereof by lapping to make the structure thin, then formed on both sides thereof with electrode films 9 and 10 each having a thickness of about 0.5 µm, respectively, and finally cut into chips. As shown in FIG. 3, thus obtained semiconductor laser chip 2 is bonded on a submount 28 so that the cap layer 8 of the chip 2 would face opposite to the submount 28. When voltage is applied across the electrode films, a laser beam is generated from the active layer 4 and emitted parallel to the submount 28 from the end face of the active layer 4.

The semiconductor laser chip 2 can be constructed according to a conventionally known process under known conditions. In addition the laser chip 2 can be of any other known stacked structure.

As described above, the beam-emitting face of the active layer 4 is spaced only several micrometers apart from the surface of the semiconductor laser chip 2. When the chip 2 is bonded at its cap layer 8 to the submount 28, it seems as if the laser beam is emitted from the surface of the submount. Since the GaAs substrate 12 is relatively thick, the semiconductor laser chip 2 on the submount 28 is also relatively thick as shown in FIG. 3. As described above, one of the subbeams produced at the diffraction grating returns to a point P located above the beam-emitting face; therefore, it is preferable to make the semiconductor laser chip thin so as to avoid unnecessary reflection. If a semiconductor laser wafer is abraded by lapping to obtain a thin chip, cracking of the semiconductor wafer tends to generate due to post-handling. Consequently the semiconductor laser wafer cannot be made thinner than 100 µm. For this reason, conventionally semiconductor laser wafers have been made to have a thickness of 100 to 120 µm.

However, even if the semiconductor laser chip made as thin as about 100 µm, interference due to the subbeam cannot be eliminated. The location where the subbeam is focused is found that it is focused on about a point at a distance D of about 80 µm±10 µm from the beam-emitting face, and that the semiconductor laser chip 2 needs to have a thickness of 80 µm at the largest so as to avoid influences of subbeam reflection.

As described above, if the semiconductor laser chip is made thinner than 100 µm by conventional mechanical abrasion such as lapping, the chip is likely to crack in the post-process so that the chip cannot serve practical purposes. The various examinations for specifying the cause of cracking during handling with regard to conventional semiconductor laser wafers which are each made thinner than 100 μm have been undergone. As a result, it has been found that cracking is caused by the interaction between a strained layer produced by lapping the semiconductor laser wafer and a force exerted on the wafer during handling, and that strains are concentrated and remain in a thin layer of the lapped surface and this strained layer serves as a trigger for cracking. Therefore, an attempt to prevent cracking during handling by removing the strained layer produced upon lapping has been undergone.

To be described next with reference to FIG. 1 is an example of the method for manufacturing a semiconductor laser according to the present invention.

On a GaAs substrate are stacked AlGaAs layers and the like to construct a semiconductor laser wafer 1 having a light-emitting region therein according to a well-known method as described above. The semiconductor laser wafer 1 at that time is about 350 μm thick. An active layer 4, which emits light, is spaced several micrometers apart from the surface of the semiconductor laser wafer 1. Hence, it seems as if the active layer is located on the surface of the semiconductor laser wafer 1 (refer to FIG. 1(a)).

In turn, the lower side, i.e. the GaAs substrate, of the semiconductor laser wafer 1 is mechanically abraded to have a thickness of about 80 μm. During this abrasion the lower side of the semiconductor wafer 1 is strained, forming a strained layer 1a (refer to FIG. 1(b)).

Subsequently, the strained layer 1a on the lower side of the semiconductor laser wafer 1 is removed by polishing with, for example, a solution of sodium hypochlorite. In an exemplary case, the lower side of the semiconductor laser wafer is chemically polished with a solution of sodium hypochlorite for about 15 minutes so as to remove the mechanically-produced strained layer 1a. As a result, the thickness of the semiconductor laser wafer 1 is reduced to about 65 μm (refer to FIG. 1(c)). The strained layer, which is produced by mechanical abrasion, can be removed by a chemical treatment. Accordingly, by removing the mechanically-produced strained layer cracking which tends to generate during post-handling can be prevented. The removal of the strained layer is carried out by polishing a surface of the strained layer with a solution of sodium hypochlorite or another polishing material similar thereto, or by etching with a mixture of sulfuric acid, hydrogen peroxide and water and the like.

In turn, by sputtering or vapor deposition, Au is deposited on the upper side of the semiconductor laser wafer 1 while an alloy such as Au-Ge alloy on the lower side thereof, to form electrode films 9 and 10. The wafer 1 is then cut into chips by dicing (refer to FIG. 1(d)), each of which is, in turn, incorporated into a package. Thus, a semiconductor laser is constructed.

Although it is conceivable to make the wafer thin only by the chemical treatment without the mechanical abrasion, or lapping, it is difficult to obtain a desired precision, for example, of about 60 μm±5 μm because a space or the like which is mechanically defined cannot be used for thickness control and, furthermore, there is required very precise control over the temperature predominating the etch rate, stirring of the etching agent the flow rate of the etching agent on the surface of the wafer, and the like.

In the present invention, accordingly, the semiconductor substrate is first mechanically abraded by lapping to substantially a desired thickness, and then the strained layer produced by lapping is removed by the chemical treatment, such as polishing or etching, which does not impose stress on the wafer. Thus, the strain existing in the semiconductor laser wafer is eliminated and, hence, cracking in the post-handling is prevented.

According to the present invention, since strain does not remain in a semiconductor laser wafer, a semiconductor laser wafer of which final thickness is only about 30 μm can be handled without damage such as crack. In fact, 50 semiconductor laser wafers each having a thickness of 30 μm according to the conventional method were all cracked, while, in contrast, only two of 50 wafers according to the present invention were cracked.

As described above, the thinner a semiconductor laser wafer is, the better for preventing reflection of subbeam. However, the thinner the wafer is, the longer it takes time for abrasion. In addition, since a wafer which is made so thin is weakened in physical strength, very much care must be taken in handling such a thin wafer, which results in a decreased labor effectiveness. On the other side, since the returning subbeam is focused on about a point spaced 80 μm±10 μm apart from the beam-emitting face, the wafer which is not made too thin but has a thickness of 30 to 80 μm hardly reflects the returning beam. More preferably, when a semiconductor laser wafer is 50 to 70 μm thick, the end face thereof is scarcely exposed to the returning subbeam and, hence, the semiconductor laser will not be affected by the returning beam. Accordingly, since there is no need to make the wafer thinner than necessary, an increase in the number of abrasion steps can be minimized, while unnecessary care need not be taken in the post-handling.

As described above, the thus obtained semiconductor laser chip is bonded on a submount and incorporated together with a photodiode for monitoring into a package thereby completing a semiconductor laser.

Thus constructed semiconductor laser is combined with a diffraction grating and an optical system including a half mirror, convex lens and the like thereby constituting a pickup device adaptable for the 3-beam method.

Further, the assembled pickup device is incorporated into an optical disk apparatus such as compact disk player, 2D player, CD-ROM player, magneto-optic memory device or the like so as to detect information recorded on the disk surface.

According to the present invention, since a semiconductor laser chip is made thin by mechanically abrading or lapping the substrate of a semiconductor laser wafer, then chemically treating it to remove the strained layer thereof, it is possible to make the semiconductor laser wafer have a thickness of 30 to 80 μm.

As a result, by constructing a semiconductor laser using such a thin laser chip, a subbeam produced by splitting a beam at a diffraction grating can be prevented from being reflected at the laser chip. Consequently, interference of such a subbeam with a normal beam will not occur, which assures a stable operation of the tracking servo for accurate detection of information from a disk. Hence, a pickup device using such a semiconductor laser can be greatly improved in reliability.

Though several embodiments of the present invention are described above, it is to be understood that the present invention is not limited only to the abovementioned embodiments, various changes and modifications may be made in the invention without departing from the spirit and scope thereof.

What is claimed is:

1. A semiconductor laser comprising:
a semiconductor laser chip bonded on a primary plane of a flat submount, the semiconductor laser chip having a face which is both mechanically and chemically treated and said semiconductor laser chip having a thickness of 30 to 80 µm.

2. A method for manufacturing a semiconductor laser comprising the steps of: sequentially stacking layers of compound semiconductor materials on a semiconductor substrate to form a semiconductor laser wafer; mechanically abrading the semiconductor substrate to make the semiconductor laser wafer thin; subjecting the mechanically abraded face of the semiconductor substrate to a chemical treatment; forming an electrode film on both sides of the semiconductor laser wafer thus treated; and cutting the semiconductor laser wafer into chips and bonding each of the chips on a submount.

3. A pickup device adaptable for a 3-beam method, comprising a combination of the semiconductor laser recited in claim 1, a diffraction grating, and an optical system.

4. An optical disk apparatus comprising the pickup device recited in claim 3.

* * * * *